United States Patent [19]

Opschoor

[11] Patent Number: 4,819,243
[45] Date of Patent: Apr. 4, 1989

[54] SEMICONDUCTOR LASER WITH ACTIVE LAYER HAVING A RADIATION EMITTING ACTIVE REGION THEREIN WHICH EXTENDS THROUGH AND IS BOUNDED BY A CURRENT LIMITING BLOCKING LAYER

[75] Inventor: Jan Opschoor, Eindhoven, Netherlands

[73] Assignee: U.S. Philips Corporation, New York, N.Y.

[21] Appl. No.: 104,896

[22] Filed: Oct. 6, 1987

[30] Foreign Application Priority Data

Oct. 23, 1986 [NL] Netherlands ............... 8602653

[51] Int. Cl.⁴ .................................. H01S 3/19
[52] U.S. Cl. ............................ 372/45; 372/46; 372/92; 372/108
[58] Field of Search ............ 372/44, 46, 50, 92, 372/108, 45; 357/17

[56] References Cited

U.S. PATENT DOCUMENTS

| | | | |
|---|---|---|---|
| 4,581,744 | 4/1986 | Takamiya et al. | 372/92 |
| 4,675,875 | 6/1987 | Takamiya | 372/45 |
| 4,675,876 | 6/1987 | Svilans | 372/96 |
| 4,706,101 | 11/1987 | Nakamura et al. | 372/46 X |

Primary Examiner—James W. Davie
Attorney, Agent, or Firm—Steven R. Biren

[57] ABSTRACT

A semiconductor laser having a layer structure including a first and a second passive layer of opposite conductivity types, an active layer therebetween which forms a pn junction with one of the passive layers, and a current-limiting blocking layer which forms a reverse-biased pn junction bounding a radiation emitting active region of the active layer. The active region has a thickness which exceeds that of the remainder of the active layer, and extends through the blocking layer at least as far as the other passive layer. This achieves effective electrical and optical confinement of the active region, enabling a sufficiently low threshold current for laser operation at room temperature.

7 Claims, 1 Drawing Sheet

SEMICONDUCTOR LASER WITH ACTIVE LAYER HAVING A RADIATION EMITTING ACTIVE REGION THEREIN WHICH EXTENDS THROUGH AND IS BOUNDED BY A CURRENT LIMITING BLOCKING LAYER

BACKGROUND OF THE INVENTION

1. Field of the Invention

The invention relates to a semiconductor laser comprising a semiconductor body having a substrate region of a first conductivity type and a layer structure disposed thereon which includes at least one first passive layer of the first conductivity type, a second passive layer of the second opposite conductivity type and an active layer interposed between the first and second passive layers. The active layer forms a pn junction which at a sufficiently high current strength in the forward direction can produce coherent electromagnetic radiation in a direction at right angles to that of the active layer in an active region of the active layer located within a resonant cavity situated between two reflectors. The layer structure also includes a current-limiting blocking layer of the second conductivity type, is interrupted at the area of the active region. The first and second passive layers and the blocking layer all have a larger band gap and a smaller refractive index for the radiation produced than the active layer, the first and second passive layers being electrically connected to connection conductors and the active region being laterally bounded by the blocking layer.

2. Description of the Related Art

Such a semiconductor laser is known from U.S. Pat. No. 4,309,670. This discloses a semiconductor laser in which an active layer having a homogeneous thickness produces radiation which emanates in a direction at right angles to the active layer. Current limitation is obtained by means of a buried blocking layer, which forms a reverse-biased pn junction with the adjoining semiconductor material. In one of the embodiments of this U.S. Patent, the active region is laterally bounded by an epitaxial semiconductor region having a larger band gap and a smaller refractive index for the emitted radiation than the active region.

Semiconductor lasers of the relevant type, in which the radiation produced is emitted in a direction at right angles to the active layer, have the advantage that they can be readily coupled to an optical fibre, the emanating beam is not very divergent and no accurate positioning of the crystal is required.

Since the length of the active region within which amplification occurs corresponds in known lasers to the thickness of the active layer and is consequently very small, a high current density is required to obtain the amplification required for the laser effect. In order to keep the threshold current at an acceptable value, fairly complicated epitaxial structures are required, while, as in the aforementioned U.S. Pat. No. 4,309,670, additional epitaxial passive layers and/or locally diffused blocking layers are used besides the active layer. For this reason inter alia, the said known laser structures can generally be realized only with great difficulty.

SUMMARY OF THE INVENTION

The present invention has for its object to avoid the said disadvantages inherent in known semiconductor lasers of this type or to reduce them at least to a considerable extent. The invention provides a new laser structure, in which both electrical and optical confinement of the active region are realized in a satisfactory manner, which has a comparatively small wavelength and a comparatively low threshold current, and which can be manufactured in a comparatively simple manner by means of modern techniques.

The invention is based inter alia on the recognition of the fact that this can be achieved by the use of an active layer which has a increased thickness in the active region.

According to the invention, a semiconductor laser of the kind described in the opening paragraph is characterised in that the active region of the active layer has a larger thickness than the remaining part of the active layer, and extends at the area of the interruption through the blocking layer at least as far as the first passive layer. The active layer is of the first conductivity type, and the blocking layer is disposed between the active layer and the substrate region.

In contrast with the mentioned known lasers, in the semiconductor laser according to the invention the thickness of the active region exceeds that of the blocking layer, which ensures the electrical and optical confinement. As a result, the active layer itself forms part of the current-limiting layer structure, which thus achieves a much simpler construction and can be realized in a simpler manner. Further, due to the very effective electrical and optical confinement, the threshold current can be low so that operation at room temperature becomes possible.

The active layer can be directly provided on the blocking layer. However, in given circumstances, it may be preferable that a further semiconductor layer of the first conductivity type having a larger band gap and a smaller refractive index for the emitted radiation than the active layer be provided between the active layer and the blocking layer. During manufacture, leakage currents, which could adversely affect the electrical confinement, are then less liable to occur.

The resonant cavity can be formed in different ways. For example, one or both reflectors may be formed by a periodical variation of the effective refractive index in the direction of the emitted radiation, according to the principle of devices known as DBR or DFB lasers. According to another preferred embodiment, the reflectors are constituted by optically flat end surfaces of the layer structure, the substrate region being provided with a cavity having a flat bottom, through which the radiation emanates, this cavity extending throughout the thickness of the substrate to the first passive layer.

The invention further relates to a particularly suitable method of manufacturing the semiconductor laser. This method is characterized in that in order of succession a first passive semiconductor layer of the first conductivity type and a blocking layer of the second opposite conductivity type are grown epitaxially on a monocrystalline substrate region of the first conductivity type. Then a cavity is formed by etching, which extends through the blocking layer to the first passive layer, and subsequently an active layer of the first conductivity type is formed by epitaxial growth from the liquid phase, an active region of this active layer filling the cavity. Finally, a second passive layer of the second conductivity type is formed by epitaxial growth on the active layer and a contact layer of the second conductivity type is formed on this passive layer, whereupon an opening extending as far as the second passive layer is etched into the contact layer opposite to the active region and a dielectric layer having a thickness equal to an optical path length of an integral number of times a quarter wavelength of the emitted radiation is provided in this opening. The substrate region and the contact layer are then provided with connection conductors.

BRIEF DESCRIPTION OF THE DRAWING

The invention will now be described more fully with reference to a few embodiments shown in the drawings, in which.

Figure 1:
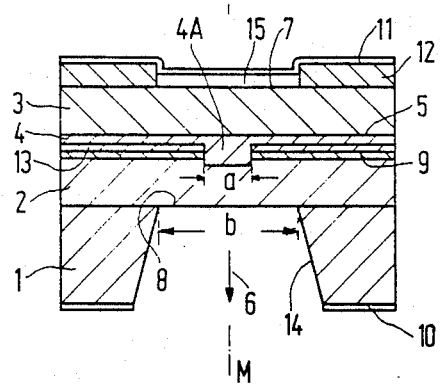
FIG. 1 shows diagrammatically in cross-section a semiconductor laser according to the invention.

The Figures are schematic and are not drawn to scale, while more particularly the dimensions in the direction of thickness are exaggerated for the sake of clarity.

Corresponding parts are generally provided with the same reference numerals in the various embodiments. Semiconductor regions of the same conductivity type are generally cross-hatched in the same direction.

DESCRIPTION OF THE PREFERRED EMBODIMENT

FIG. 1 shows diagrammatically in cross-section a semiconductor laser according to the invention. For the sake of simplicity, the semiconductor laser is assumed to be rotation-symmetrical about the line M M, although this is not absolutely necessary.

The semiconductor laser comrises a semiconductor body having a substrate region 1, which in this embodiment consists of a monocrystalline region of gallium arsenide of a first conductivity type, in this case the p conductivity type. On this substrate region 1 is disposed a layer structure comprising a first passive layer 2, which is also of the first (p) conductivity type, a second passive layer 3 of the second opposite (so in this case n) conductivity type and an active layer 4 situated between the first passive layer 2 and the second passive layer 3 and having a pn junction 5, which at a sufficiently high current strength in the forward direction can produce coherent electromagnetic radiation in the direction of the arrow 6, so at right angles to that of the active layer 4. The radiation is produced in an active region 4A of the active layer 4 and this active region is situated in a resonant cavity between two reflectors, which in this embodiment are constituted by reflecting end surfaces 7 and 8 of the layer structure. Further, the layer structure comprises a current-limiting blocking layer 9 of the second (in this case n) conductivity type, which has an interruption at the area of the active region 4A. The active layer 4, the first and second passive layers 2 and 3 and the blocking layer 9 in this embodiment all consist of gallium aluminium arsenide, the contents of aluminium being chosen so that the layers 2, 3 and 9 all have a larger band gap and consequently a lower refractive index for the radiation produced than the active layer 4. The first and second passive layers (2 and 3) are electrically connected to connection conductors constituted by electrode layers 10 and 11, respectively; the layer 2 is connected thereto through the highly doped substrate 1 and the layer 3 through an also highly doped contact layer 12 of n-type gallium arsenide. The active region 4A is laterally bounded by the blocking layer 9.

According to the invention, the active region 4A has a larger thickness than the remaining part of the active layer 4 and it extends through the area of interruption of blocking layer 9 at least as far as the first passive layer 2. Further, according to the invention, the passive layer 2 is of the first (so in this case of the p) conductivity type so that the pn junction 5 is situated between the layers 3 and 4, while the blocking layer 9 is situated between the active layer 4 and the substrate region 1.

Due to the construction of the layer structure according to the invention, in which the active region 4A is thicker than the remaining part of the active layer 4 and extends through the blocking layer 9 at least as far as the passive layer 2, a very efficient electrical and optical confinement of the generated radiation is obtained in a comparatively simple manner. As a result, a comparatively low threshold current can be attained.

In the semiconductor laser according to this embodiment, there is moreover provided between the active layer 4 and the blocking layer 9 a semiconductor layer 13 of the first (so in this case p) conductivity type consisting of gallium aluminium arsenide having a larger band gap and a smaller refractive index for the radiation produced than the active layer 4. This layer serves to prevent that in the case of possible leakage currents through the active layer 4 the current-limiting properties of the reverse-biased pn junction between the n-type blocking layer 9 and the adjoining p-type material would be aversely affected.

Further, in this embodiment, the substrate region 1 is provided with a cavity 14 having a flat bottom, through which the radiation emanates. This cavity extends throughout the thickness of the substrate region 1 to the first passive layer 2 and is adapted to receive a glass fibre coupled to the laser, as a result of which the coupling becomes very simple.

In this embodiment, the following compositions, dopings and thicknesses of the various layers are used.

| Layer | Composition | Type | Doping concentration | Thickness (μm) | Refractive index (for λ = 750 nm) |
|---|---|---|---|---|---|
| 1 | GaAs | P | $2 \times 10^{19}$ at/cm | 90 μm | |
| 2 | $Ga_{0.50}Al_{0.50}As$ | P | $10^{18}$ | 3 | 3.26 |
| 3 | $Ga_{0.50}Al_{0.50}As$ | N | $10^{18}$ | 3 | 3.26 |
| 4 | $Ga_{0.86}Al_{0.14}As$ | P | $10^{18}$ | 0.5 | 3.49 |
| 9 | $Ga_{0.80}Al_{0.20}As$ | N | $2 \times 10^{17}$ | 1 | 3.45 |
| 12 | GaAs | N | $3 \times 10^{18}$ | 1 | |

-continued

| Layer | Composition | Type | Doping concentration | Thickness (μm) | Refractive index (for λ = 750 nm) |
|---|---|---|---|---|---|
| 13 | $Ga_{0.80}Al_{0.20}As$ | P | $10^{18}$ | 0.5 | 3.45 |

The radiation emitted by this laser has a wavelength of 750 nm. The diameter (a) of the active region is about 3 μm; the diameter (b) of the substrate opening 14 is about 20 μm at the area of the bottom 8. The electrode layer 10 on the substrate 1 is, for example, a platinum molybdenum-gold layer or a platinum-tantalum-gold layer. The electrode layer 11 on the contact layer 12 of highly doped gallium arsenide consists, for example, of a gold-germanium-nickel layer, which is located opposite to the opening 14 within an opening in the contact layer 12 on a silicon oxide layer 15 having a thickness of 0.15 μm. This thickness corresponds to an optical path length of an integral number of times a quarter wavelength of the emitted radiation so that the radiation on this side of the laser structure is reflected substantially completely. The threshold current of the laser was 10 mA at 30° C.

Figure 2:
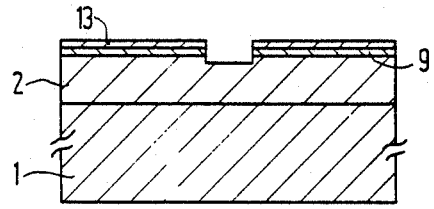
FIGS. 2 and 3 show diagrammatically in cross-section the semiconductor laser shown in FIG. 1 at successive stages of manufacture.

The semiconductor laser described can be manufactured according to the invention in the following manner. The starting material is a substrate 1 of monocrystalline p-type gallium arsenide having a doping concentration of $2.10^{19}$ atoms per cm$^3$ and a thickness of, for example, 350 μm. After the surface thereof, which preferably has a (100) orientation, has been polished and etched, there are successively grown on this surface, for example from the liquid phase (designated as LPE=Liquid Phase Epitaxy) a 3 μm thick layer 2 of p-type $Ga_{0.50}Al_{0.50}As$ having a doping concentration of $10^{18}$ atoms per cm$^3$, a 1 μm thick layer 9 of n-type $Ga_{0.8}Al_{0.2}As$ having a doping concentration of $2.10^{17}$ atoms per cm and a 0.5 μm thick layer 13 of p-type $Ga_{0.8}Al_{0.2}As$ having a doping concentration of $10^{18}$ atoms per cm$^3$. This growth may also be effected by means of metal-organic epitaxy from the vapour phase, known under the designations MOCVD or OMVPE (Organic Metallic Vapour Phase Epitaxy) technique, by chemical decomposition of organic metal compounds. For details about the LPE technique, reference may be made to the book by D. Elwell and H. J. Scheel, "Crystal Growth from High-Temperature Solutions", Academic Press 1975, p. 433–467. For details about the OMVPE technique, reference may be made to the article by M. J. Ludowise "Metal-organic Chemical Vapour Deposition of III–IV Semiconductors" in Journal of Applied Physics, Vol. 58, Oct. 15, 1985, p. R31-R55. Subsequently, in the layer structure thus obtained a hole is etched having in this example a diameter of about 3 μm just through the blocking layer 9 and preferably having a flat bottom so that the situation of FIG. 2 is obtained. The etching technique used may be, for example, "reactive ion etching" (RIE).

Now by means of OMVPE a very thin (5 nm) layer of gallium arsenide is grown (not indicated in the Figure). This is necessary to permit of carrying out the next epitaxial growth because epitaxial growth on gallium aluminium arsenide is very difficult.

Figure 3:
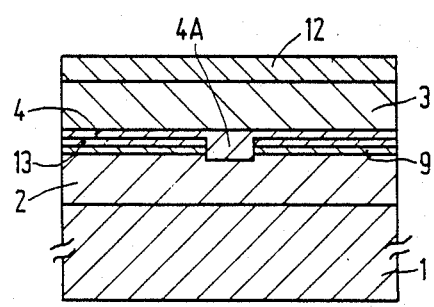

The etched hole is now filled by epitaxial growth of gallium aluminium arsenide from the liquid phase by means of the LPE technique. In this case, the hole is closed very rapidly by growth, after which the further layers are formed on the practically flat surface obtained. Thus, in order of succession the active layer 4, the passive layer 3 and the highly doped contact layer 12 (of GaAs) are grown having thicknesses of 0.5 μm, 3 μm and 1 μm, respectively, and having the composition described above (cf. FIG. 3).

A hole having a diameter of 15–20 μm is now etched into the contact layer 12 opposite to the surface 4A by means of a selective etching liquid, which attacks practically only a GaAs, but does not attack $Ga_xAl_{1-x}As$, for example a mixture of hydrogen peroxide and ammonia. The etching process then terminates at the optically flat interface of GaAs and $Ga_xAl_{1-x}As$. Subsequently, the substrate 1 is reduced to a thickness of about 90 μm by etching in, for example, a mixture of concentrated sulphuric acid, hydrogen peroxide (30%) and water (volume ratio 3:1:1), after which an opening having a diameter of about 20 μm is etched also selectively into the substrate opposite to the active region 4A by means of an aqueous solution of $H_2O_2$ and $NH_4OH$ down to the optically flat interface with the layer 2, which serves as the second reflector. After a 0.15 μm thick silicon oxide layer 15 have been provided in the opening in the contact layer 12 and the electrode layers 10 and 11 have been formed, the structure of FIG. 1 is obtained.

Figure 4:
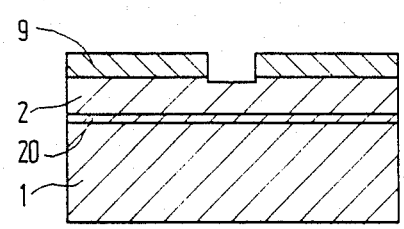
FIGS. 4, 5 and 6 show diagrammatically in cross-section successive stages of manufacture of another embodiment of the semiconductor laser according to the invention.
Figure 5:
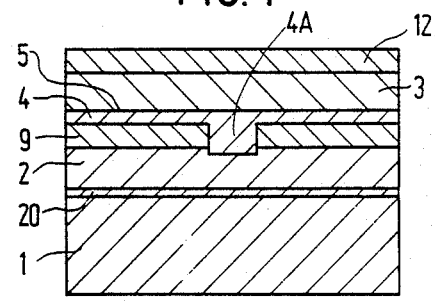
Figure 6:
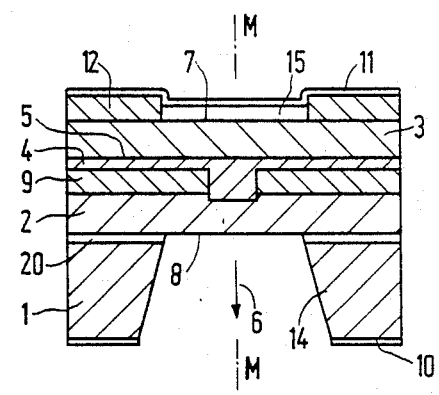

Another embodiment of a semiconductor laser according to the invention will now be described with reference to the FIGS. 4 to 6. Also in this case, the laser is assumed to be rotated-symmetrical about the line M—M, although this is not essential to the invention. This semiconductor laser is suitable to produce radiation having greater wavelengths (1.3 μm), such as frequently used for optical telecommunication purposes.

The starting material is a substrate of indium phosphide, which is p-type conducting, has a thickness of 350 μm and has a doping of $2.10^{18}$ atoms per cm$^3$. Since in this case the substrate region and the first passive layer consist of the same material, an intermediate layer 20 should first be formed on the substrate. This layer has in this embodiment a thickness of 0.3 μm and consists of p-type $In_{0.72}Ga_{0.28}As_{0.60}P_{0.40}$. Subsequently on the layer 20, which can be etched selectively with respect to indium phosphide, there are grown from the liquid phase a first passive layer 2 of p-type indium phosphide having a thickness of 6 μm and a doping concentration of $10^{18}$ atoms per cm$^3$ and then also from the liquid phase an about 1 μm thick blocking layer of n-type indium phosphide having a doping concentration of $10^{18}$ atoms per cm$^3$. Then, a hole having a diameter of, for example, 2 μm is etched into the surface and this hole extends throughout the thickness of the layer 9 into the layer 2, as a result of which the structure shown in FIG. 4 is obtained.

After that, like in the preceding embodiment, the etched cavity is filled very rapidly by epitaxial growth from the liquid phase, after which on a practically flat surface thus obtained there is provided the remaining about 0.2 μm thick part of the active layer 4, which in this case consists of p-type $In_{0.72}Ga_{0.28}As_{0.60}P_{0.40}$. Subsequently, in order of succession a second passive layer 3 of n-tye indium phosphide having a thickness of 2 μm and a doping concentration of $10^{18}$ atoms per cm$^3$ and an about 0.5 μm thick contact layer 12 of n-type $In_{0.72}Ga_{0.28}As_{0.60}P_{0.40}$ having a doping concentration of $5.10^{18}$ atoms per cm are grown, also from the liquid phase.

Then, like the preceding embodiment, an opening having a diameter of about 20 μm is etched into the contact layer 12 opposite to the active region 4A by means of a selective etchant, which does not attack the layer 3, so that an optically flat surface 7 is obtained. In this opening, a dielectric layer 15 of, for example, silicon oxide is provided, which has an optical thickness of an integral number of quarter wavelengths of the emitted radiation. After the substrate region 1 has been etched down to a thickness of about 50 μm, an opening 14 is etched into the substrate opposite to the active region 4A by means of a selective etchant, for example hydrochloric acid, which does not or substantially does not attack the intermediate layer 20. Subsequently, by means of another selective etchant, for example a solution of 5 g of potassium permanganate in 1 cm³ of concentrated sulphuric acid and 50 cm³ of water, which attacks only the intermediate layer 20, but which does not attack the indium phosphide layer 2, the layer 20 is etched down to the optically flat interface 8 between the layers 2 and 20, which serves as the second reflector. After the electrode layers 10 and 11 have been formed, the semiconductor laser shown in FIG. 6 is obtained, which can emit in the direction of the arrow 6 coherent electromagnetic radiation having a wavelength of about 1.3 μm in, for example, a fibre mounted in the cavity 14.

Figure 7:
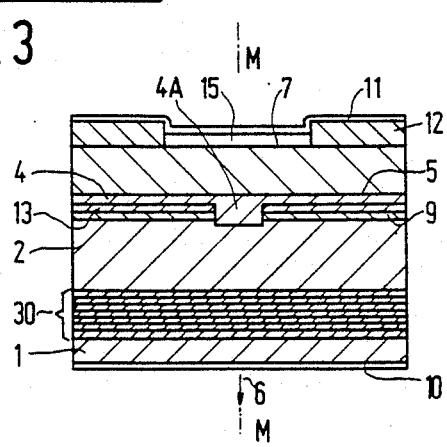
FIG. 7 shows diagrammatically in cross-section a further embodiment of the semiconductor laser according to the invention.

The reflectors need not consist of reflecting end surfaces of the laser. Other solutions are also possible, such as, for exmple, shown with reference to FIG. 7, in which instead of the reflecting end surface 8 of the preceding embodiments, a so-called DBR (Distributed Bragg Reflection) reflector is used. This reflector consists of a number of thin layers 30 alternately consisting of $Ga_{1-w}Al_wAs$ and $Ga_{1-y}Al_yAs$, where $0 \leq w \leq 1.0 \leq y \leq 1$ and $w > y$. As a result, a periodical variation of the effective refractive index is obtained in the direction of the emitted radiation 6, as also described in the aforementioned U.S. Pat. No. 4,309,670. The layers 30 are grown on a p-type surface 1 of GaAs; the semiconductor laser may otherwise be constructed in the same manner as that according to the embodiment of FIG. 1. The layer structure 30 may be obtained, for example, by epitaxial growth according to the MBE (Molecular Beam Epitaxy) or OMVPE (Organo-Metallic Vapour Phase Epitaxy) techniques. The layers consist, for example, alternately of GaAs and AlAs and all have a thickness of about 80 nm. The total number of layers of the structure 30 is, for example, twenty.

The invention is not limited to the embodiments described because many variations are possible for those skilled in the art without departing from the scope of the invention. For example, semiconductor materials other than those mentioned in the embodiments may be used. Further, the conductivity types may be all (simultaneously) replaced by the opposite conductivity types. Other layer thicknesses may be used according to the application desired. Moreover, the laser structure need not be rotation-symmetrical at all. For example, rectangular structures may also be used. Further, instead of one reflector, both reflectors may also be constructed as "Distributed Bragg Reflectors" (of the type as indicated by (30) in FIG. 7).

What is claimed is:

1. A semiconductor laser comprising a semiconductor substrate having a layer structure disposed thereon, such layer structure comprising:
   a first passive layer of a first conductivity type;
   a second passive layer of a second opposite conductivity type;
   an active layer of said first conductivity type interposed between said passive layers and forming a pn junction with said second passive layer, an area of said active layer defining an active region therein;
   a pair of reflectors forming a resonant cavity for electromagnetic radiation, said cavity being positioned so that said active region is included therein; and
   a current-limiting blocking layer of said secon conductivity type laterally bounding said active region of said active layer;
   said pn junction producing, at a sufficiently high forward current, coherent electromagnetic radiation emitted from said active region in a direction at right angles to said active layer and which is reflected by said reflectors;
   said first and second passive layers and said blocking layer each having a larger band gap and a smaller refractive index than said active layer for the radiation emitted by said active region; characterized in that:
   said blocking layer is disposed between said active layer and said first passive layer; and
   said active region of said active layer has a thickness greater than the remainder of said active layer and extends through said blocking layer at least as far as said first passive layer.

2. A semiconductor laser as claimed in claim 1, characterized in that a further semiconductor layer of the first conductivity type, having a larger band gap and a smaller refractive index for the emitted radiation than the active layer, is provided between the active layer and the blocking layer.

3. A semiconductor laser as claimed in claim 1, characterized in that said reflectors are constituted by optically flat surfaces at opposite ends of said layer structure, and said substrate region is provided with a cavity therein having a flat bottom through which the radiation, is emitted, such cavity extending through the thickness of the substrate region to said first passive layer.

4. A semiconductor laser as claimed in claim 3, characterized in that the substrate region and the first passive layer consist of the same semiconductor material, and in that a thin intermediate layer of a material which can be selectively etched with respect to the material of the substrate region and the first passive layer is provided between the substrate region and the first passive layer.

5. A semiconductor laser as claimed in claim 4, characterized in that the substrate region consists of p-type indium phosphide, the first passive layer consists of p-type indium phosphide, the active layer consists of p-type indium gallium arsenic phosphide, the second passive layer consists of n-type indium phosphide, the intermediate layer consists of p-type indium gallium arsenic phosphide and the blocking layer consists of N-type indium phosphide.

6. A semiconductor laser as claimed in any one of claims 1, 2, 3, 4 or 5 characterized in that the substrate region consists of p-type gallium arsenide, the first passive layer consists of p-type gallium aluminium arsenide, the active layer consists of p-type gallium aluminium arsenide, the second passive layer consists of n-type gallium aluminium arsenide and the blocking layer consists of n-type gallium aluminium arsenide.

7. A semiconductor laser as claimed in claim 1, characterized in that at least one of said reflectors is constituted by a periodical variation of the effective refractive index of one of said passive layers in the direction of the emitted radiation.

* * * * *